US008831897B2

(12) United States Patent
McHardy (10) Patent No.: US 8,831,897 B2
(45) Date of Patent: Sep. 9, 2014

(54) DETERMINING REMAINING LIFE FRACTION FOR BATTERY NETWORKS IN-SITU

(75) Inventor: John McHardy, Oxnard, CA (US)

(73) Assignee: Global Energy Innovations, Inc., Santa Clara, CA (US)

( * ) Notice: Subject to any disclaimer, the term of this patent is extended or adjusted under 35 U.S.C. 154(b) by 969 days.

(21) Appl. No.: 12/945,886

(22) Filed: Nov. 14, 2010

(65) Prior Publication Data

US 2012/0123712 A1   May 17, 2012

(51) Int. Cl.
*G01R 31/36* (2006.01)
*G06F 11/00* (2006.01)

(52) U.S. Cl.
CPC ...... *G01R 31/3662* (2013.01); *G01R 318/3679* (2013.01)

USPC ............ 702/63; 702/64; 702/65; 702/182

(58) Field of Classification Search
CPC . G06F 32/03; G01R 31/3679; G01R 31/3658
USPC ..................... 702/63–65, 182–190
See application file for complete search history.

(56) References Cited

U.S. PATENT DOCUMENTS

2003/0184307 A1* 10/2003 Kozlowski et al. ........... 324/427
2011/0106280 A1*  5/2011 Zeier ............................. 700/90

* cited by examiner

*Primary Examiner* — Phuong Huynh
(74) *Attorney, Agent, or Firm* — Peters Verny, LLP (57) ABSTRACT

Determination of a remaining life fraction for a network of batteries during use in an electrical circuit is disclosed. A state of health of the battery network can be determined by measuring a change in impedance characteristics of the individual battery units and/or the battery network as a whole. More specifically, a mode and a severity of a failure can be determined for individual battery units.

16 Claims, 6 Drawing Sheets

DETERMINING REMAINING LIFE FRACTION FOR BATTERY NETWORKS IN-SITU

FIELD OF THE INVENTION

The present invention relates generally, to testing electronic components, and more specifically, to determining a remaining life fraction for a network of batteries during use in an electrical circuit.

BACKGROUND OF THE INVENTION

A network of batteries can be used to provide power source redundancy for critical consumer and commercial applications. The battery network includes several batteries connected together in series, parallel, or other combinations. The applications can be active or passive. In one example, an active battery network powers a consumer's electric automobile. In another example, a passive battery network provides redundancy and failover protection for a commercial sever system using electricity wired from a power grid as a primary power source.

Battery performance can degenerate or become unreliable in response to the presence of manufacturing defects or the development of conditions such as grid corrosion, sulfation, or loss of water. Accordingly, maintenance of battery networks is important to ensure reliable performance. In particular, battery testing provides an instantaneous snapshot of performance and identifies dead batteries. Typically, the testing of a battery for performance characteristics such as cold cranking amps, state of charge, and the like require that it be removed from use. Alternatively, a battery network can be deactivated and tested as a whole.

Problematically, state of the art techniques do not provide advance warning of which batteries of a battery network are failing, why they are failing, or the severity of the failure (i.e., how soon batteries are likely to fail). As a result, it is difficult to ascertain a state of health for a battery network as a whole. It is also difficult to assess the threat of a given state of health to a particular application. Furthermore, the difficulty and time commitment for battery isolation or removal can lead to less frequent testing. Moreover, testing of a battery network as a whole ignores the condition of individual batteries. In critical applications, it is common for the entire battery network to be replaced even if only a few of the individual batteries are failing.

Therefore, what is needed is a method for testing battery networks that can be applied while the batteries are in operation, that takes into account both individual and overall battery health, and that can make adjustments for the needs of a particular application.

SUMMARY OF THE INVENTION

A method, system and computer program product for determining a remaining life fraction for a network of batteries during use in an electrical circuit. A state of health of the battery network can be determined by measuring a change in impedance characteristics of the individual battery units and/or the battery network as a whole. More specifically, a mode and a severity of a failure can be determined for individual battery units.

In one embodiment, an application of the battery network is taken into account when determining the remaining life fraction. In another embodiment, when a failing battery unit is identified, a location within a network topology is factored in to the assessment of network state of health.

In other embodiments, a response to a perturbation signal provides instantaneous impedance characteristics. Historical impedance data can provide a basis for measuring changes. In some embodiments, individual reference baselines of the individual battery units and/or a population reference baseline of the battery network are provided. The perturbation signal can comprise a multi-frequency perturbation signal. The perturbation response can comprise a real component, an imaginary component, and optionally, a phase shift. These impedance parameters can provide a fingerprint for identifying a mode of failure. Examples of failure modes include grid corrosion, sulfation, loss of water, and manufacturing defects.

In another embodiment, a testing device is installed on the battery network so that the impedance characteristics can be continuously monitored. This embodiment provides more accurate historical impedance data and continuous indications of remaining life fractions of the battery network Advantageously, in-situ battery testing non-invasively determines a state of health for a battery network without interrupting power to an application. Furthermore, premature failure of the battery network can be averted by swapping out just the defective individual battery units instead of replacing the entire network.

BRIEF DESCRIPTION OF THE DRAWINGS

In the following drawings like reference numbers are used to refer to like elements. Although the following figures depict various examples of the invention, the invention is not limited to the examples depicted in the figures.

DETAILED DESCRIPTION OF THE INVENTION

A system, method and computer program product for determining a remaining life fraction for a battery network during use in an electrical circuit is disclosed.

Figure 1:
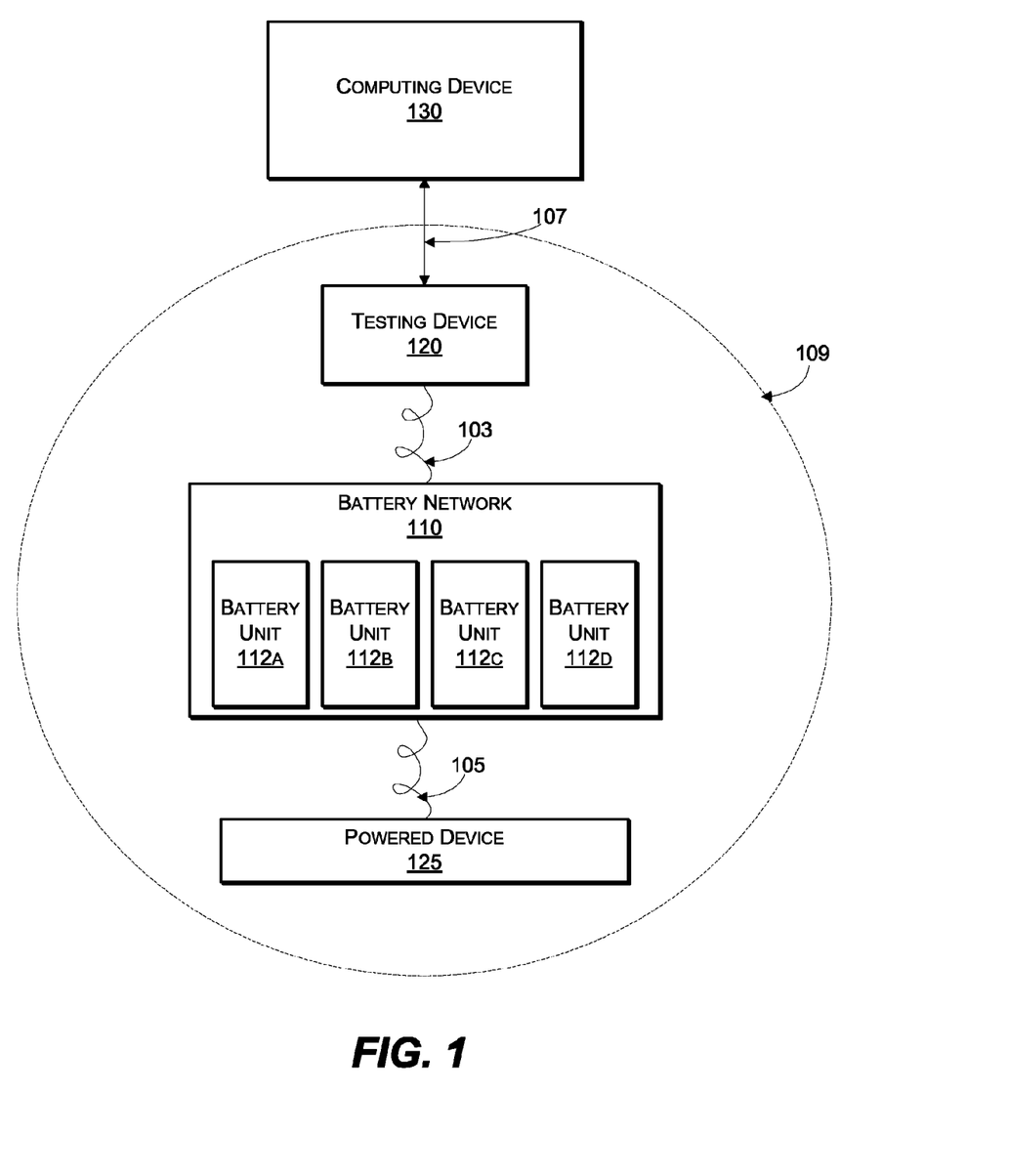
FIG. 1 is a block diagram illustrating a system to determine a remaining life fraction for a battery network during use in an electrical circuit, according to an embodiment of the present invention.

FIG. 1 is a block diagram illustrating a system 100 to determine a remaining life fraction for a battery network during use in an electrical circuit, according to an embodiment of the present invention. It will be understood that the embodiment of FIG. 1 is merely exemplary and can have alternative configurations and more or less components within the spirit of the present invention.

The system 100 generally comprises a battery network 110, a testing device 120, a computing device 130, and a powered device 125. The battery network 110 is wired to nodes of the testing device 120 during testing at a site 109 via, for example, a 4-conductor electrical cable 103. Further, the testing device 120 is connected to the computing device 130 during data transfer via channel 107 (e.g., a serial or parallel data cord, wired or wireless Ethernet channel, USB cord, FireWire cord, or the like). Lastly, powered device 125 is connected to the battery network 110 to receive AC or DC power via electrical cable 105.

The battery network 110 includes one or more individual battery units 112*a-d*. In one embodiment, the battery units 112*a-d* utilize lead acid chemistry, however, other battery chemistries can equally be used.

The battery units 112*a-d* can be of any size or capacity used for residential or commercial use. They will typically be rechargeable secondary batteries, but primary batteries are not excluded. They may be of any battery chemistry. A connection topology of the battery network 110 refers to a circuit configuration defining a flow of current between the main positive and negative terminals of the battery network 110. For example, the battery network 110 can be connected in series, in parallel, or any combination of the two. In one application, the battery network 110 can be in active use to power a mobile system, such as an electric-powered automobile. In another application, the battery network 110 can be in reserve use as backup power for a telecommunications system.

The testing device 120 can be, for example, a handheld device configured with hardware and firmware specific to battery testing, such as the EC1000 produced by Global Energy Innovations of San Jose, Calif. In one embodiment, the testing device 120 generates and inputs a excitation or perturbation signal (or signals) of a known frequency (or frequencies), and known current amplitude and phase. The perturbation signal is applied to each of the battery units 112*a-d* in turn. The amplitude and phase shift of the voltage responses of the batteries to the excitation signals at the various frequencies are measured, and used to derive impedance values for the battery. In other embodiments, the excitation signal can be a square wave or a triangle wave, or a voltage or a current step, and the testing device 120 derives impedance values for the battery from the battery's response to those excitation signals. In one implementation, the testing device 120 is also able to measure temperature (and temperature differential between terminals), voltage, specific gravity, and other characteristics of the battery network 110.

The computing device 130 can be a personal computer, a server blade, a laptop computer, a single-board computer, or any other type of processor-controlled device. In one implementation, the testing device 120 is used on site 109 for immediate, basic testing results while the computing device 130, having more processing power, a larger display and a more complete keyboard, can be used off site for further analysis and for baseline modification and adjustment. Data can be uploaded in batch mode after collection from the sites, or in real time through a wireless network connection. Moreover, computing device 130 can configure test settings and download them, and data such as historical or adjusted baselines, to testing device 120.

The powered device 125 can be any device drawing power for operation from the battery network 110. For example, the powered device 125 can be an electrical automobile, a personal computer or a network server, a section of a railroad system, a bank security system, a commercial property, or the like.

Figure 2:
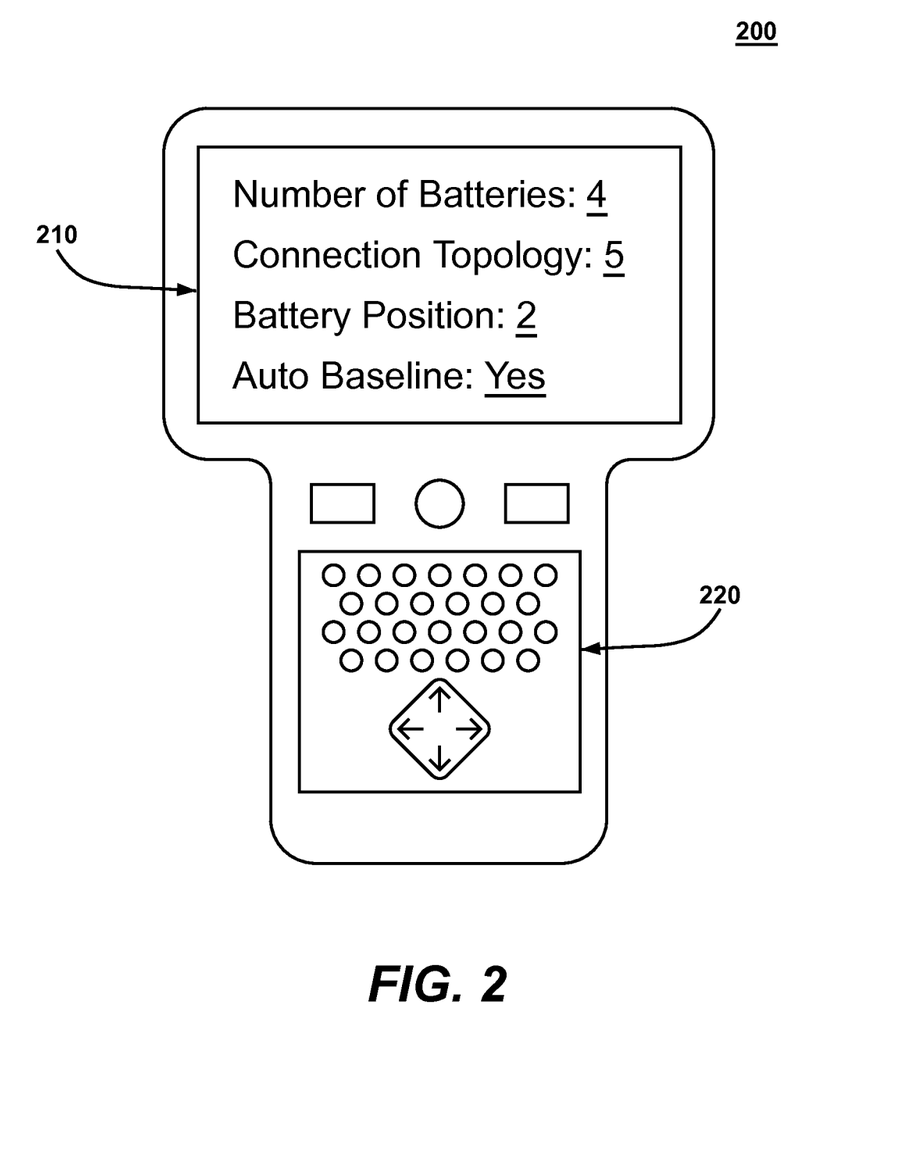
FIG. 2 is a schematic diagram illustrating a testing device, according to an embodiment of the present invention.

FIG. 2 is a schematic diagram illustrating an exemplary testing device 200 (such as the testing device 120), according to an embodiment of the present invention. The testing device 120 is a handheld device and includes a display screen 210 and a keypad 220. The testing device 120 can be enclosed in a casing made of suitable materials, such as durable plastic with a rubber grip for rugged environments. It is understood that testing device 120 is merely an example which can be varied while remaining within the spirit of the present invention.

In one implementation, a service person carries the testing device 200 from one site to another to be used in troubleshooting or maintenance of installations. In another implementation, the testing device 200 is deployed in a laboratory environment in which operating conditions are simulated. In another alternative embodiment, the testing device 200 is permanently installed for continuous monitoring of a battery network.

Figure 3:
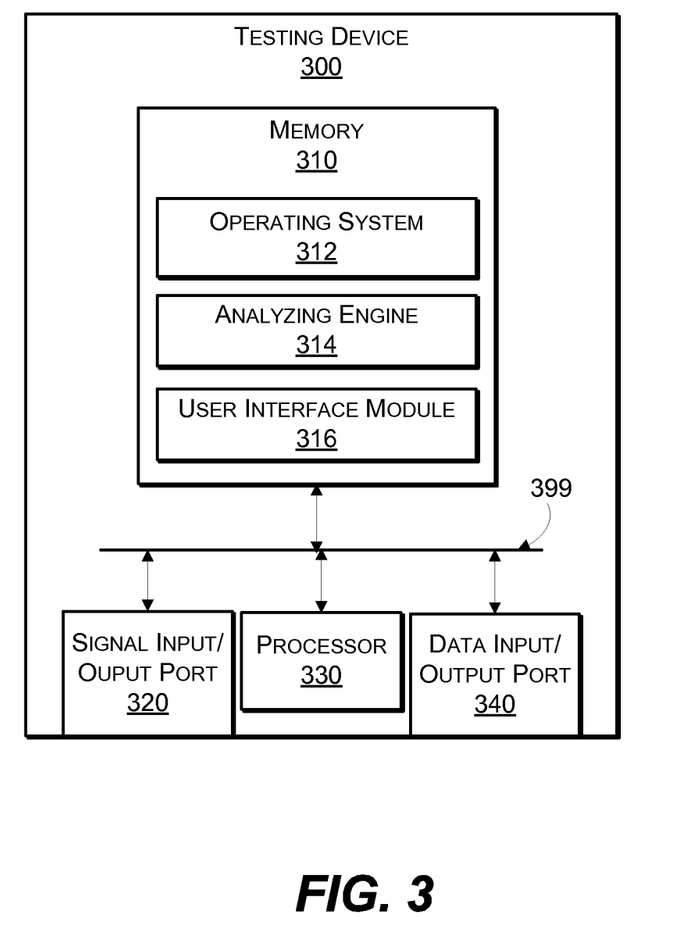
FIG. 3 is a schematic diagram illustrating a testing device, according to an embodiment of the present invention.

FIG. 3 is a block diagram showing exemplary components internal to a testing device 300 (such as testing device 120). The data input/output port 340 can be connected to external data sources, such as computing device 130 of FIG. 1, to send or receive historical impedance data and other information such as individual reference baselines for individual battery units and a population reference baseline for the battery network.

The signal input/output port 320 is coupled to the battery network 110 of FIG. 1 to send a perturbation signal and receive a response signal. In an embodiment, the response signal is measured to identify changes in impedance characteristics of an individual battery unit. In another embodiment, the impedance characteristics include a real component, an imaginary component, and optionally, a phase shift. These additional characteristics provide additional data points for identifying a mode of failure as discussed in more detail below.

The memory 310 can be RAM, FLASH, volatile, non-volatile or any other suitable type of memory device. The processor 330 can be a RISC, FPGA, ASIC, a CPU or mobile processor by Intel Corporation, or any other suitable type of processor device. The processor 330 can be a single core or multi core. Source code for an operating system 312, an analyzing engine 314 and a user interface module 316 can be stored in the memory 310 and executed by the processor 330. The operating system 312 (e.g., Linux or Windows based operating system) can be a mobile version and support single threaded or multi threaded operations.

The analyzing engine 314 can be implemented in software, hardware, or a combination of both. In one embodiment, the analyzing engine 314 can derive impedance data from a response perturbation signal in order to determine a mode of failure for individual battery units. In another embodiment, the analyzing engine 314 can predict a remaining life fraction for a battery network and output an overall state of health. In still another embodiment, the analyzing engine 314 determines the severity of a failure. The user interface module 316 allows a user to enter and view relevant data. For example, a network topology can be entered and a state of health finding can be displayed. Additional embodiments of the analyzing engine 314 and the user interface module 316 are described in detail below.

Figure 4:
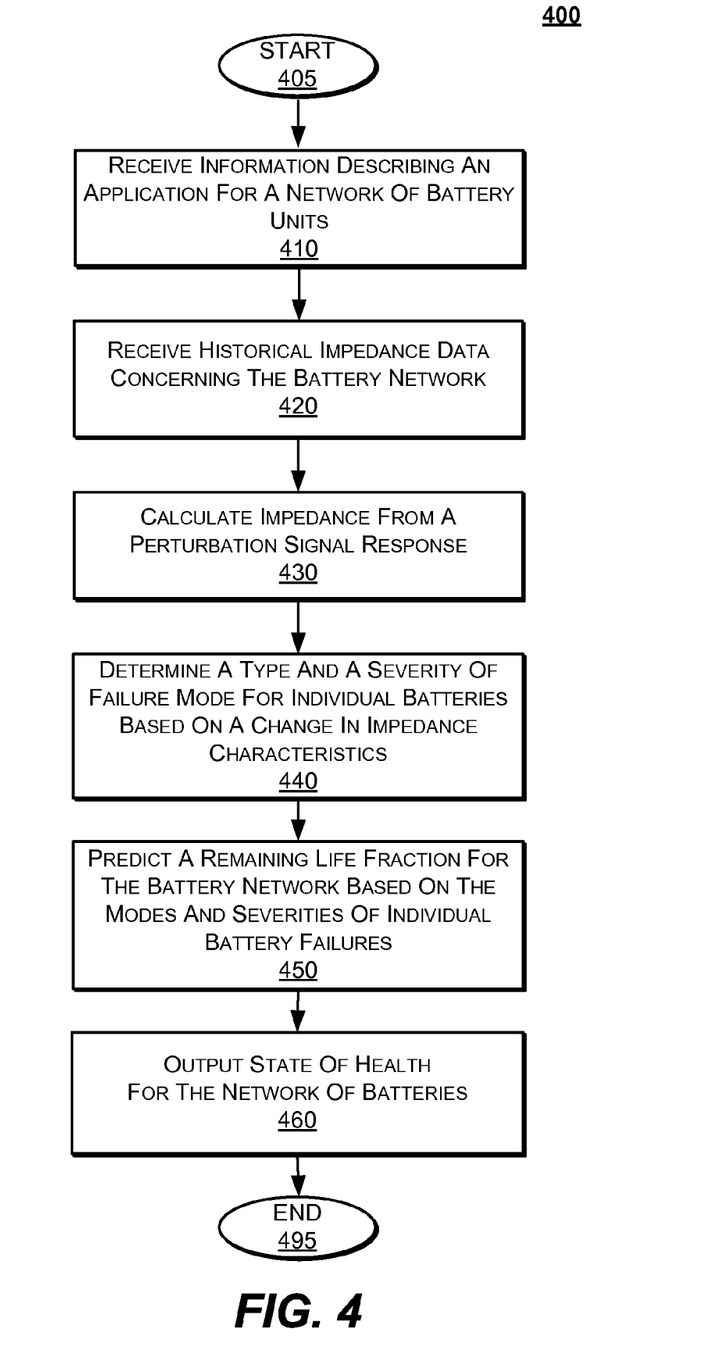
FIG. 4 is a flow diagram illustrating a method for determining a remaining life fraction for a battery network during use in an electrical circuit, according to an embodiment of the present invention.

FIG. 4 is a flow diagram illustrating a method 400 for determining a remaining life fraction for a battery network during use in an electrical circuit, according to an embodiment of the present invention. The method 400 can be implemented, for example, in the system 100 of FIG. 1.

Information describing an application for a battery network is received 410 (e.g., by the data input/output port 340 or by the user interface module 316). The application is relevant to a remaining life fraction of a battery unit and an overall state of health of a battery network due to variations in use. For example, some applications require high current bursts at low temperature (cold cranking amps), some require frequent and numerous charging and discharging cycles, some require high reliability, and others require minimal performance loss during long-term standby. In one embodiment, an application category can be selected. In another embodiment, raw data figures of usage can be input.

Historical impedance data concerning the battery network is received 420. This data can be stored locally (e.g., from previous testing) or downloaded from a network or by direct connection to a PC. In one embodiment, historical impedance data is part of a reference baseline derived over one or more previous instances of testing. An individual referenced baseline describes characteristics of an individual battery unit while a population referenced baseline describes characteristics of a battery network. In another embodiment, historical impedance data is provided by the manufacturer from testing or specifications (e.g., the data can be downloaded from manufacturer Internet sites).

An impedance is calculated 430 from the electrical response of a battery to a perturbation signal (e.g., by signal input/output port 320). An electrical perturbation signal is applied to a battery network in the form of a DC offset or an AC waveform (e.g., a sinusoidal waveform). Instantaneous impedance data can be calculated by comparing the input signal to the output signals, and characterized in terms of real impedance and imaginary impedance. Additional data, such as phase offset, can also be calculated.

Figure 5:
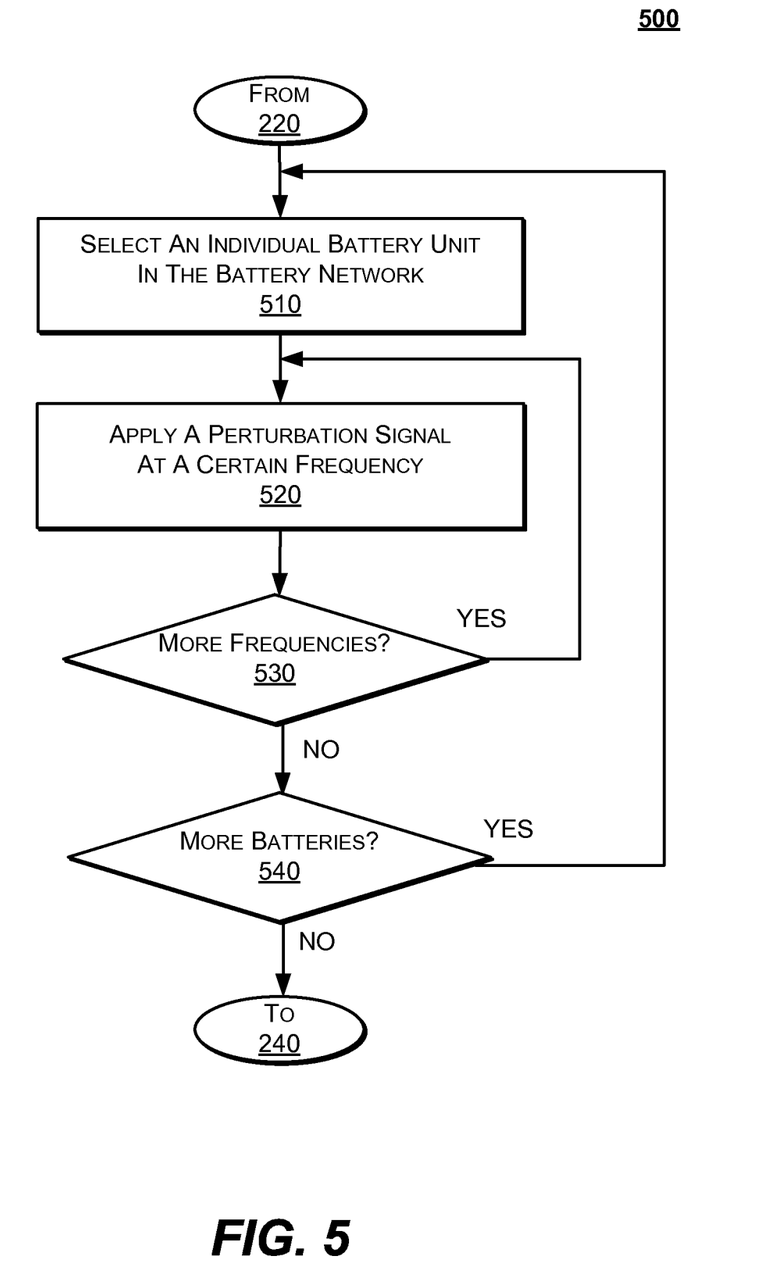
FIG. 5 is a flow diagram illustrating a method for determining instantaneous impedance data from a multi-signal perturbation signal response, according to an embodiment of the present invention.

An example of a multi-frequency perturbation signal application is set forth in FIG. 5. Accordingly, an individual battery unit is selected 510 for application 520 of a perturbation signal at a certain frequency (or frequency range). At step 530, additional frequencies (or frequency ranges) are cycled through over an entire spectrum. At step 540, additional individual battery units are tested.

Referring again to FIG. 4, the severity of failure for individual battery units is estimated 440, based on a change in impedance characteristics. Historical impedance characteristics are compared to instantaneous impedance characteristics to identify changes beyond a predetermined threshold. These changes help determine and quantify the failure mode. Failure severity (i.e., the probability of imminent failure) can be expressed qualitatively (e.g., high, average, low), or quantitatively (e.g., 10%, 50%, 90%, or the like.)

Figure 6:
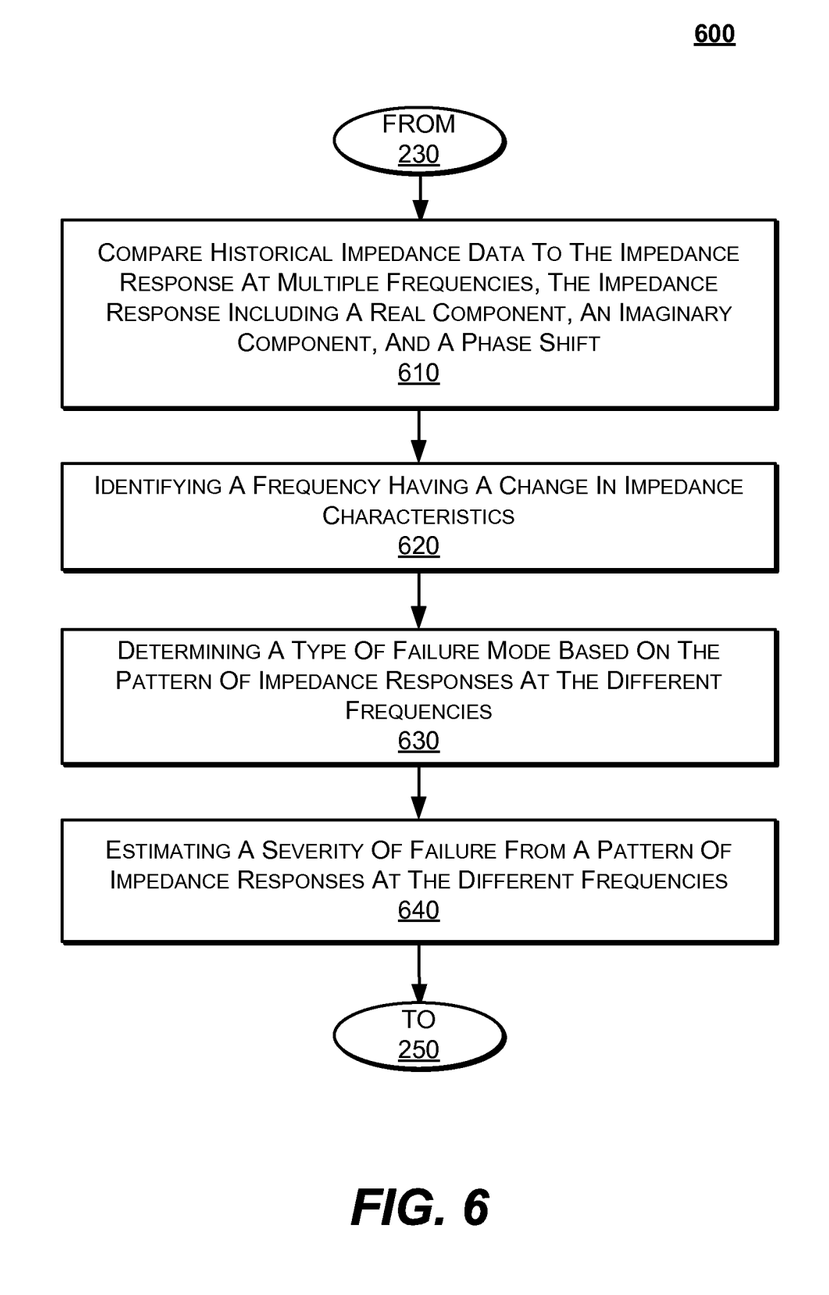
FIG. 6 is a flow diagram illustrating a method for determining the mode and severity of failure for individual battery units based on a change in impedance characteristics, according to an embodiment of the present invention.

An example of the steps taken to identify a failure and estimate its severity using a multi-frequency perturbation signal response is shown in FIG. 6. In one embodiment, historical impedance data is compared 610 to instantaneous impedance data at several different frequencies. One or more frequencies having a change in impedance characteristics are identified 620. A mode of failure is estimated 630 by an algorithm that combines information from a pattern of impedance changes at the different frequencies. In a similar manner, the severity of failure is also determined 640, based on the pattern of impedance change and at the different frequencies. Specifically, a frequency response spectrum can serve as a fingerprint for certain failure modes. Examples of failure modes include grid corrosion, sulfation, loss of water, and manufacturing defects.

In another embodiment, the failure mode is determined from changes in the real component, imaginary component, and/or phase shift of the response signal relative to historical impedance data. For example, a change in just the imaginary component can be indicative of minor sulfation. Even further, a subsequent change in the real component can be indicative of severe sulfation. In another example, a change in the real component, without a corresponding change to the imaginary component, can be indicative of water loss. In an alternative embodiment, infant mortality of a battery unit as a result of manufacturing defects can be identified from an initial impedance response, rather than a change over time.

Another indicator of the failure mode includes identifying a temperature differential between the terminal posts of an individual battery unit. Namely, a temperature differential between a positive terminal and a negative terminal can be indicative of grid corrosion on one of the terminals. The temperature differential is a consequence of increased resistance on the terminal. The above embodiments are merely illustrative of determining a failure mode from changes in impedance characteristics.

Referring again to FIG. 4, a remaining life fraction for a battery or a battery network is predicted 450 based on the mode and severity of failure determined for individual battery units. In general, a life fraction quantifies an instantaneous state of health for a battery or a battery network relative to some design point. In many applications, the end of life (EOL) design point for a battery is some minimum acceptable charge storage capacity, e.g., 75% of the "nameplate" capacity specified by the manufacturer. In that case, the EOL capacity for an 80 Ah battery would be 60 Ah and such a battery (or network of such batteries) that can store a maximum of 70 Ah, would have a remaining life fraction of: (80−70)/80−60) or 50%. To determine the remaining life fraction of the battery network, in one embodiment, the effect of individual battery units is mathematically weighted according to its position in the network. For example, a single dead battery can increase the rate of life loss in adjacent battery units but the magnitude of the effect will depend on the location of that battery unit within the network topology.

A state of health for the batteries is output in some embodiments 460. The output can be to a user interface of the testing device. In one embodiment, a permanently installed testing device can be networked to a centralized computer system and the state of health can be sent to a monitor. In an automobile, the state of health can be displayed on a dashboard (e.g., a green, yellow or red indication). Many other design-specific variations are possible.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention in which all terms are meant in their broadest, reasonable sense unless otherwise indicated. Any headings utilized within the description are for convenience only and have no legal or limiting effect.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. A computer-implemented method for determining a remaining life fraction for a network of battery units, comprising:
   receiving information describing an application for the network of battery units;

receiving historical impedance data concerning the network of battery units;

measuring an instantaneous impedance response to a perturbation signal applied to each of the battery units while in operation for the application;

determining a mode and estimating a severity of a failure for at least one individual battery unit from a change in impedance characteristics between historical and instantaneous impedance; and predicting a remaining life fraction for the network of battery units based on the mode and the severity of failure of the at least one individual battery unit.

2. The method of claim 1, wherein the application comprises a passive application of the network of battery units while in operation as a back-up source of power to a primary source of power, and wherein predicting the remaining life fraction is also based on the application.

3. The method of claim 1, wherein the application comprises an active application of the network of battery units while in operation as a primary source of power, and wherein predicting the remaining life fraction is also based on the application.

4. The method of claim 1, wherein identifying the change in impedance comprises identifying an increased spread among individual battery units in the degree of change of at least one of the impedance characteristics.

5. The method of claim 1, wherein the perturbation signal comprises a multi-frequency perturbation signal, and wherein estimating the mode and severity of the failure comprises identifying a change in impedance characteristics across multiple frequencies.

6. The method of claim 5, wherein determining the mode and estimating the severity of the failure is based on the impedance response of the at least one battery unit to the multi-frequency perturbation signal.

7. The method of claim 5, wherein the failure mode comprises corrosion of the positive electrode grid.

8. The method of claim 5, wherein the failure mode comprises loss of water.

9. The method of claim 5, wherein the failure mode comprises sulfation.

10. The method of claim 5, wherein the failure mode comprises a manufacturing defect.

11. The method of claim 1, wherein the measured impedance response comprises a real component, an imaginary component, and a phase shift, and wherein determining the mode and the severity of the failure is based on a change in at least one of the real component, the imaginary component and the phase shift.

12. The method of claim 11, wherein a change in the imaginary component indicates that the failure mode is sulfation.

13. The method of claim 1, further comprising:

identifying a temperature differential between negative and positive terminals of the at least one individual battery, wherein the temperature differential indicates that the failure mode is grid corrosion.

14. The method of claim 1, further comprising:

receiving information describing a topology of the network of battery units that describes a relative location of individual battery units; and adjusting the estimation of the severity of the failure in accordance with a relative location for the at least one battery unit.

15. A non-transitory computer-readable medium storing a computer product for a method for determining a life fraction for a network of battery units, the method comprising:

receiving information describing an application for the network of battery units;

receiving historical impedance data concerning the network of battery units;

measuring an instantaneous impedance response to a perturbation signal applied to each of the battery units while in operation for the application;

determining a mode and estimating a severity of a failure for at least one individual battery unit from a change in impedance characteristics between historical and instantaneous impedance; and predicting a remaining life fraction for the network of battery units based on the mode and the severity of failure of the at least one individual battery unit.

16. A testing device to determine a life fraction for a network of battery units, comprising:

a user interface module to receive information describing an application for the network of battery units;

a data input to receive historical impedance data concerning the network of battery units;

a signal input to measure an instantaneous impedance response to a perturbation signal applied to each of the battery units while in operation for the application; and an analyzing engine communicatively coupled to the user interface module, the data input and the signal input, the analyzing engine determining a mode and estimating a severity of a failure for at least one individual battery unit from a change in impedance characteristics between historical and instantaneous impedance response, and the analyzing engine predicting a remaining life fraction for the network of battery units based on the mode and the severity of failure of the at least one individual battery unit.

* * * * *

UNITED STATES PATENT AND TRADEMARK OFFICE
CERTIFICATE OF CORRECTION

PATENT NO. : 8,831,897 B2
APPLICATION NO. : 12/945886
DATED : September 9, 2014
INVENTOR(S) : McHardy et al.

Page 1 of 1

It is certified that error appears in the above-identified patent and that said Letters Patent is hereby corrected as shown below:

Title page

Item 75 should read –

Inventor: John McHardy, Oxnard, CA (US)
Kurt Salloux, Palo Alto, CA (US)

Signed and Sealed this
Third Day of March, 2015

Michelle K. Lee
*Deputy Director of the United States Patent and Trademark Office*